US012590997B2

(12) United States Patent
Yender et al.

(10) Patent No.: US 12,590,997 B2
(45) Date of Patent: Mar. 31, 2026

(54) METHOD AND SYSTEM FOR CALCULATING ELECTRICAL CHARACTERISTICS OF AN ELECTRIC HEATER

(71) Applicant: WATLOW ELECTRIC MANUFACTURING COMPANY, St. Louis, MO (US)

(72) Inventors: Matthew Yender, Winona, MN (US); Stanton H. Breitlow, Winona, MN (US)

(73) Assignee: WILLOW ELECTRIC MANUFACTURING COMPANY, St. Louis, MO (US)

( * ) Notice: Subject to any disclaimer, the term of this patent is extended or adjusted under 35 U.S.C. 154(b) by 701 days.

(21) Appl. No.: 17/955,629

(22) Filed: Sep. 29, 2022

(65) Prior Publication Data

US 2023/0109326 A1 Apr. 6, 2023

Related U.S. Application Data

(60) Provisional application No. 63/250,655, filed on Sep. 30, 2021.

(51) Int. Cl.
| | |
|---|---|
| *G01R 19/25* | (2006.01) |
| *G01R 19/257* | (2006.01) |
| *H05B 3/00* | (2006.01) |

(52) U.S. Cl.
CPC ..... *G01R 19/2506* (2013.01); *G01R 19/2513* (2013.01); *G01R 19/257* (2013.01); *H05B 3/0019* (2013.01)

(58) Field of Classification Search
CPC .......................... H05B 1/0233; G01R 19/2506
See application file for complete search history.

(56) References Cited

U.S. PATENT DOCUMENTS

| | | | |
|---|---|---|---|
| 4,549,073 A * | 10/1985 | Tamura | G05D 23/2401 |
| | | | 219/505 |
| 4,876,502 A | 10/1989 | Verbanets et al. | |

(Continued)

FOREIGN PATENT DOCUMENTS

| | | | |
|---|---|---|---|
| EP | 1465459 A1 * | 10/2004 | F27D 19/00 |
| EP | 1465459 B1 | 10/2004 | |

(Continued)

OTHER PUBLICATIONS

Search Report issued in corresponding TW Application 111137033, mailed Sep. 13, 2023, 1 page.

(Continued)

*Primary Examiner* — Woody A Lee, Jr.
(74) *Attorney, Agent, or Firm* — Burris Law, PLLC

(57) ABSTRACT

A method of controlling temperature of a heater including a resistive heating element includes measuring a voltage count and a current count based on data from an analog-digital converter (ADC) circuit of a sensor circuit, where the sensor circuit is electrically coupled to the heater. The method includes selecting one or more dynamic gain levels of the ADC from among a plurality of dynamic gain levels based on a shift gain correlation, determining a resistance of the resistive heating element based on the voltage count, the current count, and the one or more dynamic gain levels, and controlling power to the heater based on the resistance.

18 Claims, 8 Drawing Sheets

(56) References Cited

U.S. PATENT DOCUMENTS

| | | | |
|---|---|---|---|
| 7,196,295 | B2 | 3/2007 | Fennewald et al. |
| 8,552,346 | B2 * | 10/2013 | Ambal .............. H01L 21/67248 |
| | | | 219/390 |
| 10,690,705 | B2 | 6/2020 | Breitlow et al. |
| 10,908,195 | B2 | 2/2021 | Breitlow et al. |
| 2011/0174801 | A1 * | 7/2011 | Schwerman ............ H05B 1/02 |
| | | | 219/509 |
| 2013/0128396 | A1 * | 5/2013 | Danesh .................. G01R 23/02 |
| | | | 361/45 |
| 2018/0348265 | A1 * | 12/2018 | Hopkins-Breitlow ........................ |
| | | | F24D 11/0207 |
| 2021/0263542 | A1 * | 8/2021 | Breitlow ........... H01L 21/67103 |

FOREIGN PATENT DOCUMENTS

| | | | | |
|---|---|---|---|---|
| JP | H11204865 A | * | 7/1999 | |
| TW | 202106918 A | | 2/2021 | |
| WO | WO-2012118830 A2 | * | 9/2012 | ............. F24F 11/88 |
| WO | WO-2017216598 A1 | * | 12/2017 | ............. G01R 25/00 |

OTHER PUBLICATIONS

International Search Report issued in corresponding International Application No. PCT/US2022/045128, mailed Dec. 23, 2022.

* cited by examiner

METHOD AND SYSTEM FOR CALCULATING ELECTRICAL CHARACTERISTICS OF AN ELECTRIC HEATER

CROSS-REFERENCE TO RELATED APPLICATIONS

This application claims priority to and the benefit of U.S. Provisional Application 63/250,655 filed on Sep. 30, 2021. The disclosure of the above application is incorporated herein by reference.

FIELD

The present disclosure relates to calculating electrical characteristics of the electric heater.

BACKGROUND

The statements in this section merely provide background information related to the present disclosure and may not constitute prior art.

A thermal system generally includes a heater having resistive heating elements and a control system for controlling power to the heater to generate heat at a temperature setpoint. In an example application, a semiconductor process system includes a thermal system having a pedestal heater, which includes a heating plate with a ceramic substrate and one or more resistive heating elements that define one or more heating zones.

In some applications, the heater can be a "two-wire" heater in which the resistive heating elements function as heaters and as temperature sensors with two leads wires operatively connected to the heating element rather than four. A control system configured to control the heater determines the temperature of the resistive heating elements based on the resistance of the resistive heating element. Specifically, the control system calculates the resistance based on voltage and/or current measurements and determines the temperature of the resistive heating element based on the calculated resistance. Typically, voltage and current measurements are calibrated to accurately determine resistance at various temperature setpoints, and resistance-to-temperature correlation data is used to determine the temperature based on calculated resistance. However, at certain power or temperature ranges, it can be difficult to obtain accurate resistance measurements and the corresponding temperature measurements.

SUMMARY

This section provides a general summary of the disclosure and is not a comprehensive disclosure of its full scope or all of its features.

The present disclosure provides a method of controlling temperature of a heater including a resistive heating element. The method includes measuring a voltage count and a current count based on data from an analog-to-digital converter (ADC) circuit of a sensor circuit, where the sensor circuit is electrically coupled to the heater. The method includes selecting one or more dynamic gain levels of the ADC from among a plurality of dynamic gain levels based on a shift gain correlation, determining a resistance of the resistive heating element based on the voltage count, the current count, and the one or more dynamic gain levels, and controlling power to the heater based on the resistance.

The following includes variations of the method of controlling temperature of the heater of the above paragraph, which may be implemented individually or in any combination.

In one form, the one or more dynamic gain levels include a voltage dynamic gain level, a current dynamic gain level, or a combination thereof. In one form, the method further includes determining a voltage value based on a ratio of the voltage count and the voltage dynamic gain level and determining a current value based on the ratio of the current count and the current dynamic gain level, where the resistance of the resistive heating element is further based on the voltage value and the current value. In one form, selecting the one or more dynamic gain levels based on the shift gain correlation further comprises determining, while the ADC has selected a given voltage dynamic gain level from among the plurality of dynamic gain levels, whether the voltage count is greater than a voltage shift-down threshold; and selecting the voltage dynamic gain level as the one or more dynamic gain levels in response to the voltage count being greater than the voltage shift-down threshold, where the voltage dynamic gain level is less than the given voltage dynamic gain level. In one form, selecting the one or more dynamic gain levels based on the shift gain correlation further comprises determining, while the ADC has selected a given voltage dynamic gain level from among the plurality of dynamic gain levels, whether the voltage count is less than a voltage shift-up threshold; and selecting the voltage dynamic gain level as the one or more dynamic gain levels in response to the voltage count being less than the voltage shift-up threshold, where the voltage dynamic gain level is greater than the given voltage dynamic gain level.

In one form, selecting the one or more dynamic gain levels based on the shift gain correlation further comprises determining, while the ADC has selected a given current dynamic gain level from among the plurality of dynamic gain levels, whether the current count is greater than a current shift-down threshold; and selecting the current dynamic gain level as the one or more dynamic gain levels in response to the current count being greater than the current shift-down threshold, where the current dynamic gain level is less than the given current dynamic gain level. In one form, selecting the one or more dynamic gain levels based on the shift gain correlation further comprises determining, while the ADC has selected a given current dynamic gain level from among the plurality of dynamic gain levels, whether the current count is less than a current shift-up threshold; and selecting the current dynamic gain level as the one or more dynamic gain levels in response to the current count being less than the current shift-up threshold, where the current dynamic gain level is greater than the given current dynamic gain level.

In one form, the method further includes determining a plurality of voltage null counts and a plurality of current null counts when no electrical power is provided to the heater, where the resistance is further based on the plurality of voltage null counts and the plurality of current null counts. In one form, each of the plurality of voltage null counts is associated with one of the plurality of dynamic gain levels; and each of the plurality of current null counts is associated with one of the plurality of dynamic gain levels. In one form, the method further includes determining a voltage value based on a difference between the voltage count and a given voltage null count from among the plurality of voltage null counts; and determining a current value based on a difference between the current count and a given current null count from among a plurality of current null counts, where the resistance of the resistive heating element is further based on the voltage value and the current value. In one form, the method further includes determining a plurality of voltage drift counts and a plurality of current drift counts, where the resistance is further based on the plurality of voltage drift counts and the plurality of current drift counts.

The present disclosure provides a system for controlling temperature of a heater including a resistive heating element. The system includes one or more processors configured to execute instructions stored in a nontransitory computer-readable medium. The instructions include obtaining data from an analog-digital converter (ADC) circuit of a sensor circuit that is electrically coupled to a heater; measuring a voltage count and a current count based on the data; and selecting a voltage dynamic gain level and a current dynamic gain level of the ADC from among a plurality of dynamic gain levels based on a shift gain correlation. The instructions include determining a resistance of the resistive heating element based on the voltage count, the current count, the voltage dynamic gain level, and the current dynamic gain level; and controlling power to the heater based on the resistance.

The following includes variations of the system for controlling temperature of the heater of the above paragraph, which may be implemented individually or in any combination.

In one form, the instructions further comprise determining a voltage value based on a ratio of the voltage count and the voltage dynamic gain level; and determining a current value based on the ratio of the current count and the current dynamic gain level, where the resistance of the resistive heating element is further based on the voltage value and the current value. In one form, the instructions for selecting the voltage dynamic gain level based on the shift gain correlation further comprise: determining, while the ADC has selected a given voltage dynamic gain level from among the plurality of dynamic gain levels, whether the voltage count is greater than a voltage shift-down threshold; and selecting the voltage dynamic gain level in response to the voltage count being greater than the voltage shift-down threshold, where the voltage dynamic gain level is less than the given voltage dynamic gain level. In one form, the instructions for selecting the voltage dynamic gain level based on the shift gain correlation further comprise: determining, while the ADC has selected a given voltage dynamic gain level from among the plurality of dynamic gain levels, whether the voltage count is less than a voltage shift-up threshold; and selecting the voltage dynamic gain level in response to the voltage count being less than the voltage shift-up threshold, where the voltage dynamic gain level is greater than the given voltage dynamic gain level.

In one form, the instructions for selecting the current dynamic gain level based on the shift gain correlation further comprise: determining, while the ADC has selected a given current dynamic gain level from among the plurality of dynamic gain levels, whether the current count is greater than a current shift-down threshold; and selecting the current dynamic gain level in response to the current count being greater than the current shift-down threshold, where the current dynamic gain level is less than the given current dynamic gain level. In one form, the instructions for selecting the current dynamic gain level based on the shift gain correlation further comprise: determining, while the ADC has selected a given current dynamic gain level from among the plurality of dynamic gain levels, whether the current count is less than a current shift-up threshold; and selecting the current dynamic gain level in response to the current count being less than the current shift-up threshold, where the current dynamic gain level is greater than the given current dynamic gain level.

In one form, the instructions further comprise determining a plurality of voltage null counts and a plurality of current null counts when no electrical power is provided to the heater, and where the resistance is further based on the plurality of voltage null counts and the plurality of current null counts. In one form, each of the plurality of voltage null counts is associated with one of the plurality of dynamic gain levels; and each of the plurality of current null counts is associated with one of the plurality of dynamic gain levels. In one form, the instructions further comprise determining a voltage value based on a difference between the voltage count and a given voltage null count from among the plurality of voltage null counts; and determining a current value based on a difference between the current count and a given current null count from among a plurality of current null counts, where the resistance of the resistive heating element is further based on the voltage value and the current value. In one form, the instructions further comprise determining a plurality of voltage drift counts and a plurality of current drift counts, and where the resistance is further based on the plurality of voltage drift counts and the plurality of current drift counts.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1A:
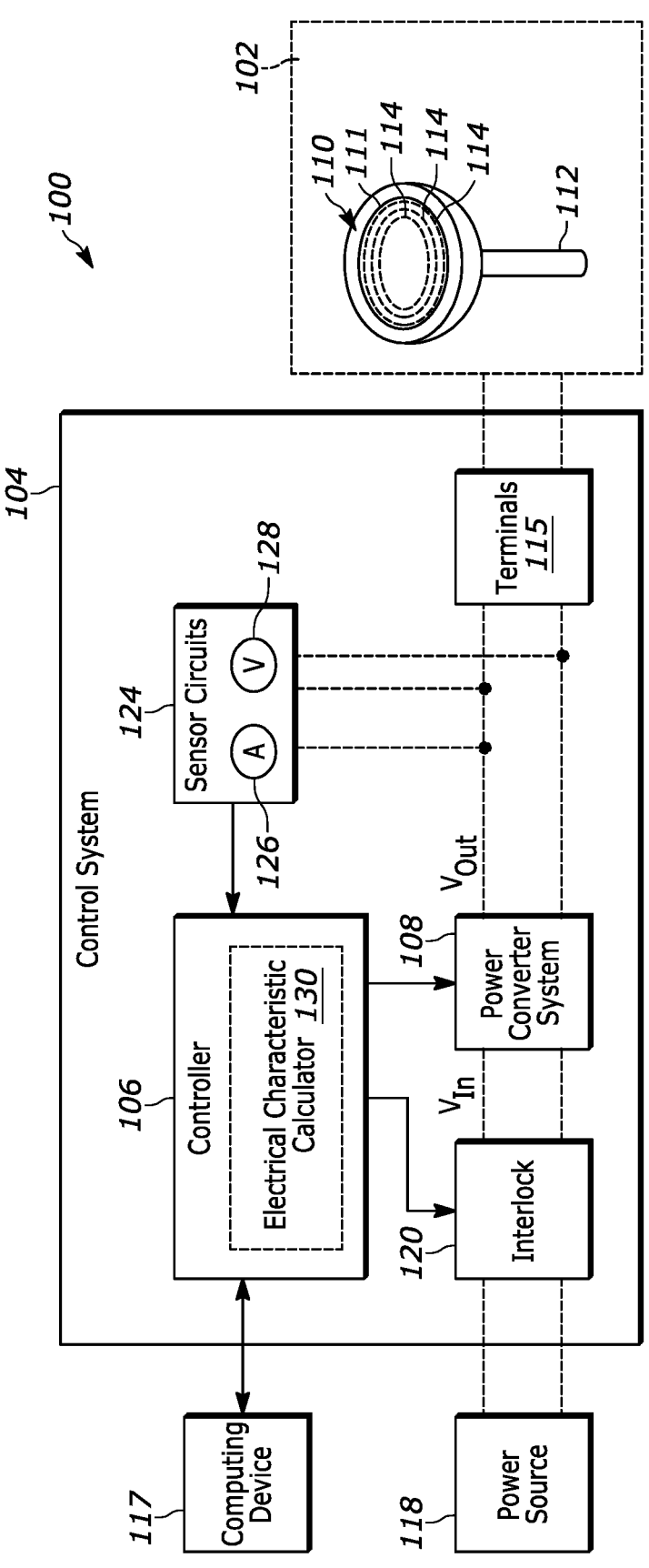
FIG. 1A is a block diagram of a thermal system having an electrical characteristic calculator in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1B:
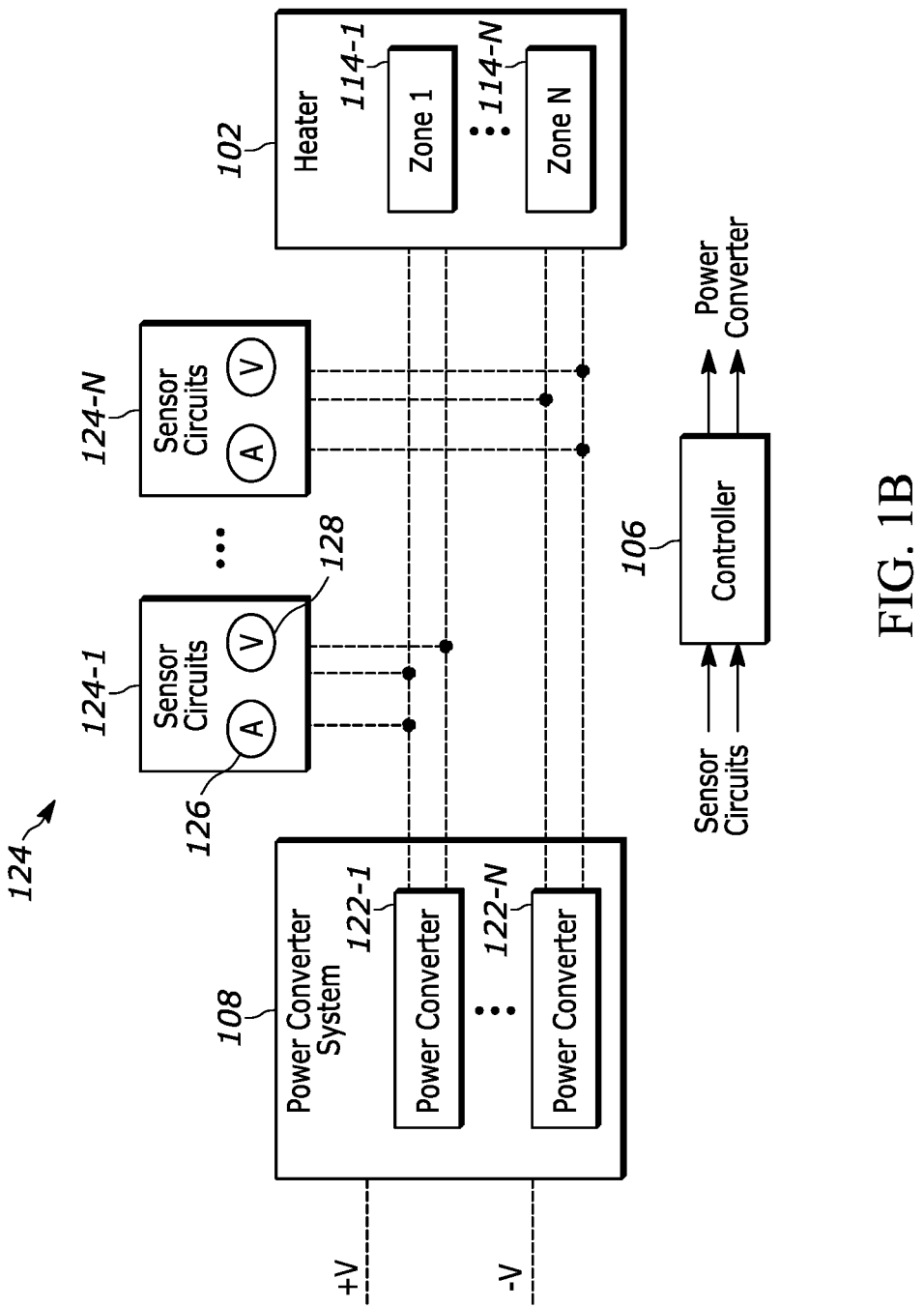
FIG. 1B is a block diagram of a control system of the thermal system of FIG. 1A.

Referring to FIGS. 1A and 1B, a thermal system 100 includes a multizone pedestal heater 102 and a control system 104. The control system 104 includes a controller 106 and a power converter system 108. In one form, the heater 102 includes a heating plate 110 and a support shaft 112 disposed at a bottom surface of the heating plate 110. The heating plate 110 includes a substrate 111 and a plurality of resistive heating elements (not shown) embedded in or disposed along a surface of the substrate 111. In one form, the substrate 111 may be made of ceramic or aluminum. The control system 104 independently controls the resistive heating elements, which define a plurality of heating zones 114, as illustrated by the dashed-dotted lines in FIG. 1A. It should be understood that the heating zones may be configured in various manners and may include any number of heating zones while remaining within the scope of the present disclosure. Furthermore, while the controller 106 is described in association with a multizone heater, the heater 102 may include one or more zones and is not limited to two or more zones.

In one form, the heater 102 is a "two-wire" heater in which the resistive heating elements function as heaters and as temperature sensors with two lead wires operatively connected to the resistive heating element rather than four. Such two-wire capability is disclosed in, for example, U.S. Pat. No. 7,196,295, which is commonly assigned with the present application and incorporated herein by reference in its entirety. Typically, in a two-wire system, the resistive heating elements are defined by a material that exhibits a varying resistance with varying temperature such that an average temperature of the resistive heating element is determined based on a change in resistance of the resistive heating element. In one form, the resistance of the resistive heating element is calculated by first measuring the voltage across and the current through the heating elements and then, using Ohm's law, determining the resistance.

The control system 104 controls the operation of the heater 102 and, more particularly, independently controls power provided to each of the zones 114. In one form, the control system 104 is electrically coupled to the zones 114 via terminals 115 such that each zone 114 is coupled to two terminals that provide power and sense temperature.

In one form, the control system 104 is communicably coupled (e.g., via a wireless and/or wired communication link) to a computing device 117 having one or more user interfaces, such as a display, a keyboard, a mouse, a speaker, a touch screen, among others. Using the computing device 117, a user may provide inputs or commands for the thermal system 100, such as temperature setpoints, power setpoints, and commands to execute a test or a process stored by the control system 104.

The control system 104 is electrically coupled to a power source 118 that supplies an input voltage (e.g., 240V, 208V) to the power converter system 108 by way of an interlock 120. The interlock 120 controls power flowing between the power source 118 and the power converter system 108 and is operable by the controller 106 as a safety mechanism to shut-off power from the power source 118. While illustrated in FIG. 1A, the control system 104 may not include the interlock 120 in other variations.

In one form, the power converter system 108 is configured to adjust the input voltage and apply an output voltage ($V_{OUT}$) to the heater 102. In one form, the power converter system 108 includes a plurality of power converters 122 (122-1 to 122-N in FIG. 1B) that are configured to apply an adjustable power to the resistive heating elements of a given zone 114 (114-1 to 114-N in figures). One example of such a power converter system is described in U.S. Pat. No. 10,690,705, which is commonly owned with the present application and the contents of which are incorporated herein by reference in its entirety. In this example, each power converter system 108 includes a buck converter that is operable by the controller to generate a desired output voltage for one or more heating elements of a given zone 114. Accordingly, the power converter system 108 is operable to provide a customizable amount of power (i.e., a desired power) to each zone 114 of the heater 102. It should be readily understood that other power converter systems may be employed for providing the desired power and the present disclosure is not limited to the example provided herein.

With the use of a two-wire heater (as the heater 102), the control system 104 includes sensor circuits 124 (i.e., 124-1 to 124-N in FIG. 1B) to measure electrical characteristics of the resistive heating elements (i.e., voltage and/or current), which is used to determine resistance and temperature. In one form, each sensor circuit 124 includes an ammeter 126 and a voltmeter 128 to measure a current flowing through and a voltage applied to the heating element(s) in a given zone 114, respectively. In one form, the ammeter 126 and the voltmeter 128 are provided as a power metering chip to simultaneously measure current and voltage regardless of the power being applied to the heating element.

In one form, the controller 106 includes one or more microprocessors and memory for storing computer readable instructions executed by the microprocessors. In one form, the controller 106 is configured to perform one or more control processes in which the controller 106 determines the desired power to be applied to the heater 102, such as 100% of input voltage, 90% of input voltage, etc. The desired power can be determined based on various information, such as, but not limited to, electrical characteristics of the heater (e.g., voltage, current, and/or resistance), a temperature of the heater, an operation state of the heater (e.g., soft-start, ramp-up, steady state, ramp-down, etc.), and/or desired setpoints (e.g., temperature setpoint, ramp-up rate setpoint, ramp-down rate setpoint, power setpoint, etc.). Example control processes are described in U.S. Pat. No. 10,690,705 provided above, and U.S. Pat. No. 10,908,195, which is commonly owned with the present application and the contents of which are incorporated herein by reference in its entirety. In one form, the controller 106 performs a closed-loop temperature control in which the temperature of the heater 102 is controlled to a temperature setpoint.

An electric heater (as the heater 102) may not use the full range of operation power (i.e., voltage and/or current) during operation, and the heater 102 may employ more power during ramp-up or during a setpoint change than maintaining the heater 102 at a desired temperature. Thus, the heater 102 may primarily operate in the lower end of a power band. At the low end of the power band, the accuracy of the measured resistance decreases, and therefore, the accuracy of the measured temperature decreases, thereby making it difficult to control the electric heater. Accordingly, the controller 106 may include an electrical characteristic calculator (ECC) 130 that is configured to improve the accuracy of the resistance determination performed by the controller 106. Specifically, the ECC 130 is configured to read voltage counts and current counts (i.e., V-I counts) and determine a resistance of the resistive heating element of the heater 102 based on the V-I counts. Additional details regarding the ECC 130 are provided below.

In one form, the sensor circuit 124 includes an analog-to-digital converter (ADC) configured to measure voltage (e.g., a peak voltage or a root-mean-square (RMS) voltage at the power delivery or sense terminals of the ADC) and current (e.g., a peak current or an RMS current measured across a shunt resistor). The voltage and the current may be collectively referred to hereinafter as "V-I." In one form, the ADC produces counts, which are integer representations of a millivolt (mV) input signal level and are typically 12, 16, or 24-bit values. In a non-limiting example, an ADC that is a 24-bit device produces counts in the range of 0-16,777,215 ($\pm$8,388,607). Generally, using calibration data, the sensor circuit 124 converts the V-I counts to actual voltage and current measurements. In lieu of the actual voltage and current measurements, the ECC 130 determines the resistance (R) based on a ratio of a voltage value and a current value. The voltage value is based on a ratio of the voltage counts ($V_{Counts}$) and a voltage dynamic gain level ($V_{Gain}$), and the current value is based on a ratio of the current counts ($I_{Counts}$) and a current dynamic gain level ($I_{Gain}$), as shown below in relation (1).

$$R=(V_{Counts}/V_{Gain})/(I_{Counts}/I_{Gain}) \qquad (1)$$

Accordingly, the determined resistance is a unitless value independent of calibration accuracy of the sensor circuit 124. The current dynamic gain level of the ADC and the voltage dynamic gain level of the ADC are collectively referred to hereinafter as the "dynamic gain levels," and additional details regarding the dynamic gain levels of the ADC are provided below.

In one form, the ADC may have a fixed gain such that the entire operational range (i.e., power range) of the product may be measured. The fixed gain may reduce the accuracy of the resistance measurement at low power levels, and as such, the full measurement range of the ADC is typically not, or is rarely, utilized. Accordingly, the ECC 130 is configured to disregard the fixed gain when determining the resistance of the resistance heating element of the heater 102 and select the one or more dynamic gain levels of the ADC.

In one form, the ADC includes a programable gain amplifier (PGA) to select/adjust one or more dynamic gain levels from among a plurality of dynamic gain values of the ADC. As an example, the PGA includes six selectable voltage dynamic gain levels and six selectable current dynamic gain levels, such as 1, 2, 4, 8, and 16, and the PGA is configured to independently adjust/select the voltage dynamic gain level and the current dynamic gain level. It should be understood that the voltage dynamic gain levels and the current dynamic gain levels may be set such that they are not independent of each other. By dynamically adjusting the gain of the ADC, the fidelity of V-I counts and the resistance measurement is improved, thereby improving resistance-based control routines of the heater 102, as described below in further detail.

In one form, the ADC selects the dynamic gain levels based on a shift gain correlation that correlates each dynamic gain level with a shift-up threshold and a shift-down threshold (collectively referred to hereinafter as "shift thresholds"). In one form, the shift thresholds are provided as threshold counts for increasing or decreasing the dynamic gain levels. The ADC selects the shift thresholds such that there is substantially no overlap after the dynamic gain level shift and adequate room after the shift (i.e., hysteresis).

As an example, when the voltage counts ($V_{Counts}$) are greater than a voltage shift-down threshold, the ADC decreases the voltage dynamic gain level ($V_{Gain}$) (e.g., the ADC decreases $V_{Gain}$ from a given voltage dynamic gain level of 4 to 2 when $V_{Counts}$ are greater than the voltage shift-down threshold of 16,000,000 counts). As another example, when the voltage counts ($V_{Counts}$) are less than a voltage shift-up threshold, the ADC increases the voltage dynamic gain level ($V_{Gain}$) (e.g., the ADC increases $V_{Gain}$ from a given voltage dynamic gain level of 4 to 8 when $V_{Counts}$ are less than the voltage shift-up threshold of 4,000,000 counts). It should be understood that the shift-down and shift-up threshold values are merely examples and should not be limited to these examples described herein.

As a further example, when the current counts ($I_{Counts}$) are greater than a current shift-down threshold, the ADC decreases the current dynamic gain level ($I_{Gain}$) (e.g., the ADC decreases $I_{Gain}$ from a given current dynamic gain level of 4 to 2 when $I_{Counts}$ are greater than the current shift-down threshold of 8,000,000 counts). As yet another example, when the current counts ($I_{Counts}$) are less than a current shift-up threshold, the ADC increases the current dynamic gain level ($I_{Gain}$) (e.g., the ADC increases $I_{Gain}$ from a given current dynamic gain level of 4 to 8 when $I_{Counts}$ are less than the current shift-up threshold of 2,000,000 counts). While various example dynamic gain levels and shift thresholds are provided, it should be understood that the various dynamic gain levels may be associated with various V-I counts and shift thresholds and are not limited to the examples described herein.

In one form, the ECC 130 is configured to employ a stabilization delay in response to the ADC decreasing or increasing at least one of the current dynamic gain level and voltage dynamic gain level. In one form, the stabilization delay is based on a settling time of the ADC (i.e., the amount of time for converging to a final count value) or is arbitrarily defined. As an example, when the ECC 130 adjusts the current (or voltage) dynamic gain level, the ECC 130 does not begin obtaining the V-I counts until after the stabilization delay elapsing. As another example, when the ECC 130 adjusts the current (or voltage) dynamic gain level, the ECC 130 discards the V-I counts obtained prior to the stabilization delay period elapsing. By employing the stabilization delay when adjusting the dynamic gain levels, the ECC 130 may further improve the accuracy of the V-I counts. It should be understood that the stabilization delay may not be employed in some forms.

In one form, the ECC 130 is configured to adjust the V-I counts based on a plurality of voltage null counts and a plurality of current null counts (collectively referred to hereinafter as "null counts"). More particularly, the ECC 130 is configured to perform a count compensation determination to determine V-I counts when the voltage and the current are zero (i.e., no electrical power is provided to the heater 102). As an example, for each dynamic gain level and with the power off, the count compensation determination reads and stores the V-I counts from the ADC, as null counts for the respective dynamic gain level (i.e., a current null count for each current dynamic gain level and a voltage null count for each voltage dynamic gain level). The ECC 130 is configured to use the null counts to compensate for the measured counts during operation and measure the resistance (R), as shown below in relations (2)-(4).

$$V_{Comp\text{-}counts} = V_{Counts} - V_{Null\text{-}counts} \qquad (2)$$

$$I_{Comp\text{-}counts} = I_{Counts} - I_{Null\text{-}counts} \qquad (3)$$

$$R = (V_{Comp\text{-}counts}/V_{Gain})/(I_{Comp\text{-}counts}/I_{Gain}) \qquad (4)$$

In relation (2), "$V_{Null\text{-}counts}$" is the voltage null count determined during the count compensation determination for the given voltage dynamic gain level being employed, and "$V_{Comp\text{-}counts}$" is the compensated voltage count (i.e., the difference between the voltage counts and the corresponding voltage null count). In relation (3), "$I_{Null\text{-}counts}$" is the current null count determined during the count compensation determination for the current dynamic gain level being employed, and "$I_{Comp\text{-}counts}$" is the compensated current count (i.e., the difference between the current counts and the corresponding current null count). As shown in relation (4), the ECC 130 determines a voltage value based on a ratio of the compensated voltage value and the corresponding voltage dynamic gain level being employed, a current value based on a ratio of the compensated current value and the corresponding current dynamic gain level being employed, and the resistance value based on the voltage and current values.

In one form, the ECC 130 is configured to determine the resistance based on a plurality of voltage drift counts and a plurality of current drift counts (collectively referred to hereinafter as "drift counts"). The drift counts may be representative of an induced voltage count error and/or current count error at a given temperature due to, for example, performance degradation and/or an age associated with the sensor circuits 124 (e.g., a power metering chip of the controller 106), the power converters 122, among other components of the control system 104. As an example, the measured voltage counts may be 5,000 counts less than (or greater than) the actual voltage counts when applying electrical power to increase the temperature of the resistive heating element of the heater 102 based on a setpoint heater temperature, which thereby causes the temperature of, for example, the sensor circuits 124 to increase by 50° C. (i.e., 100 voltage counts/1° C.). As another example, the measured current counts may be 10,000 counts greater than (or less than) the actual current counts when applying electrical power to increase the temperature of the resistive heating element of the heater 102 based on a setpoint heater temperature, which thereby causes the temperature of, for example, the sensor circuits 124 to increase by 50° C. (i.e., 200 current counts/1° C.). As such, the ECC 130 is configured to perform a drift current count compensation determination for each current dynamic gain level and a drift voltage count compensation determination for each voltage dynamic gain level to determine the drift counts.

To determine the current drift counts, the ECC 130 determines a difference between the compensated current counts (or the current counts) determined by the ADC and an expected current count that corresponds to sensor data output by a separate reference temperature sensor (not shown) proximate to (i.e., adjacent and/or near) the power metering chip, voltage dividers, current shunt, or other measurement components having a known (or empirically defined) count value per degree Celsius/Fahrenheit, where the reference temperature sensor is configured to generate data indicative of the temperature proximate to or of the measurement component. To determine the voltage drift counts, the ECC 130 determines a difference between the compensated voltage counts (or the voltage counts) determined by the ADC and an expected voltage count that corresponds to sensor data output by a separate reference sensor configured to generate data indicative of the temperature proximate to or of the measurement component. In some forms, the ECC 130 periodically updates the drift counts to further improve the accuracy of the compensated voltage and/or current counts. It should be understood that the drift counts may not be employed in some forms.

Figure 2:
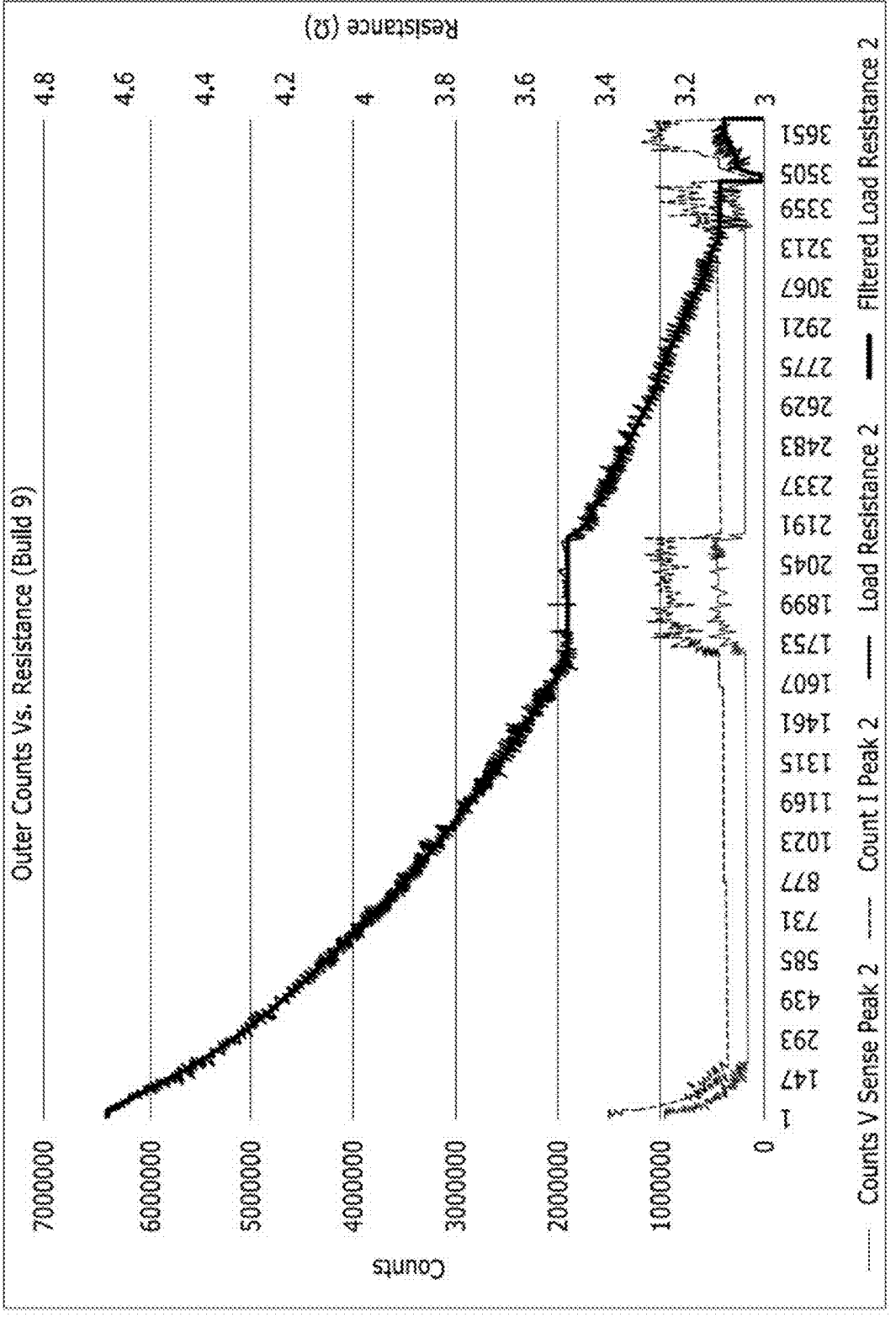
FIG. 2 is a graph illustrating resistance curves determined without a dynamic gain shift in accordance with the teachings of the present disclosure.
Figure 3:
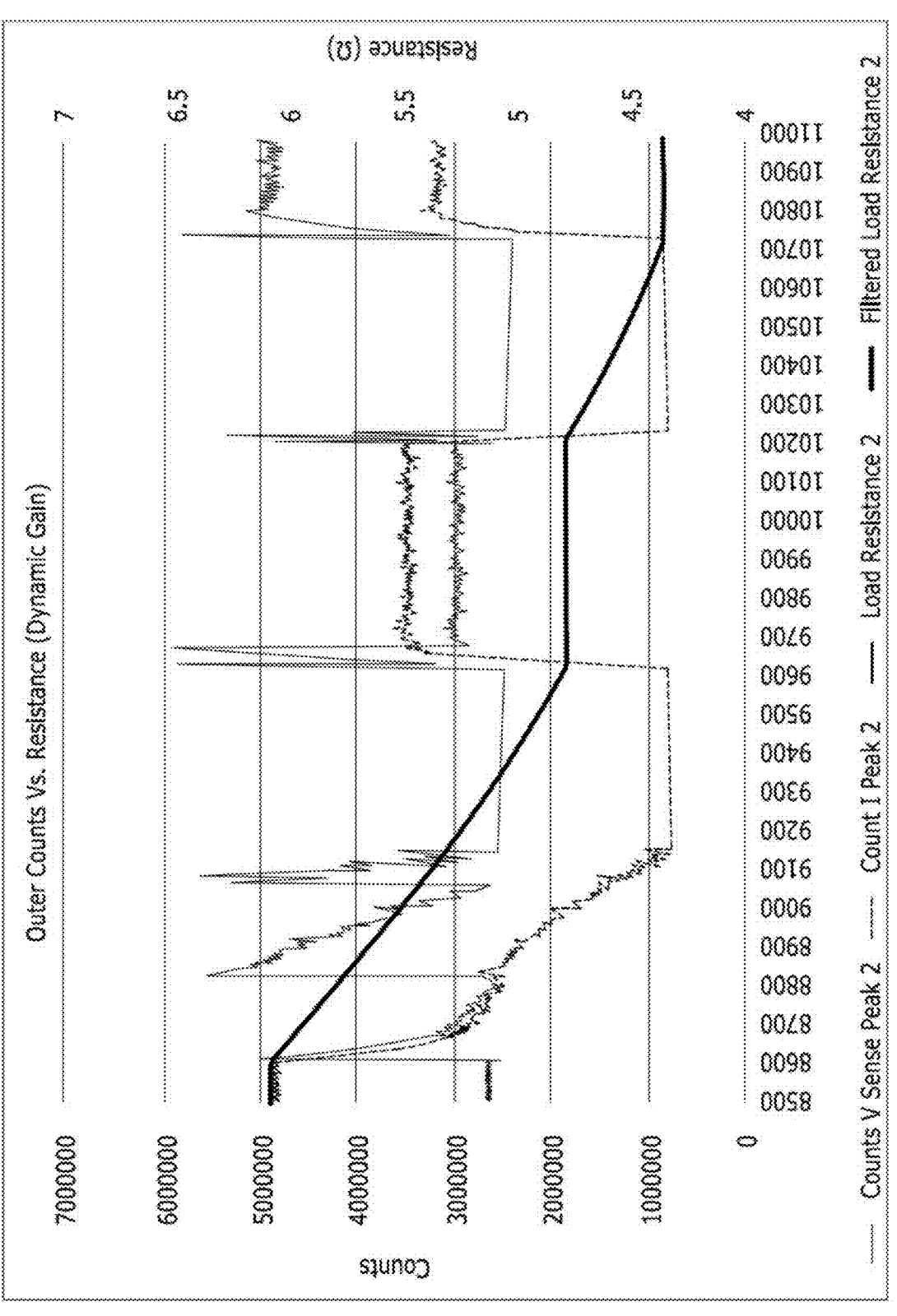
FIG. 3 is a graph illustrating resistance curves determined with a dynamic gain shift in accordance with the teachings of the present disclosure.

FIGS. 2-5 are graphs illustrating features of the method performed by the ECC 130 of the present disclosure. More particularly, FIGS. 2 and 3 are graphs illustrating V-I counts and resistance curves in which the resistance is calculated without and with dynamic gain shift, respectively. As illustrated in FIG. 2, the $V_{Counts}$ and $I_{Counts}$ are limited to approximately 1,000,000 and about 2,000,000, respectively, and the calculated resistance (i.e., load resistance) overlaps with the filtered resistance but still fluctuates. With the dynamic gains shift (FIG. 3), the $V_{Counts}$ and $I_{Counts}$ are magnified at times to approximately 6,000,000 and 5,000, 000, respectively. By increasing the fidelity of the $V_{Counts}$ and the $I_{Counts}$, the calculated resistance is smoother and closer to the filtered resistance. With a fixed gain, the full measurement range of the PGA is not utilized. Accordingly, the ECC 130 is further configured to include dynamic gain shift in which the gain for the $V_{Counts}$ and the $I_{Counts}$ are adjusted independently of one another.

Figure 4:
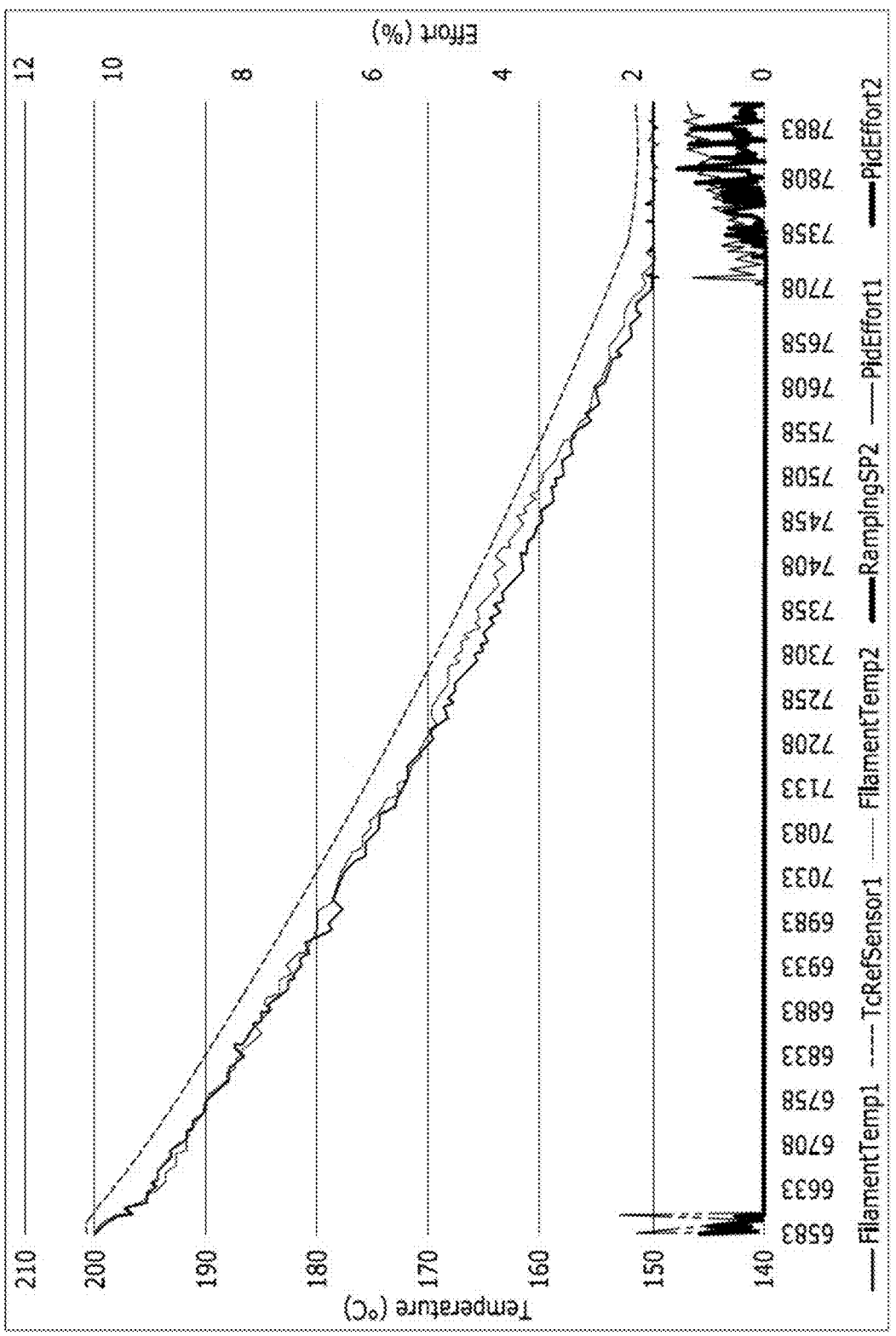
FIG. 4 is a graph illustrating temperature curves determined without a dynamic gain shift in accordance with the teachings of the present disclosure.
Figure 5:
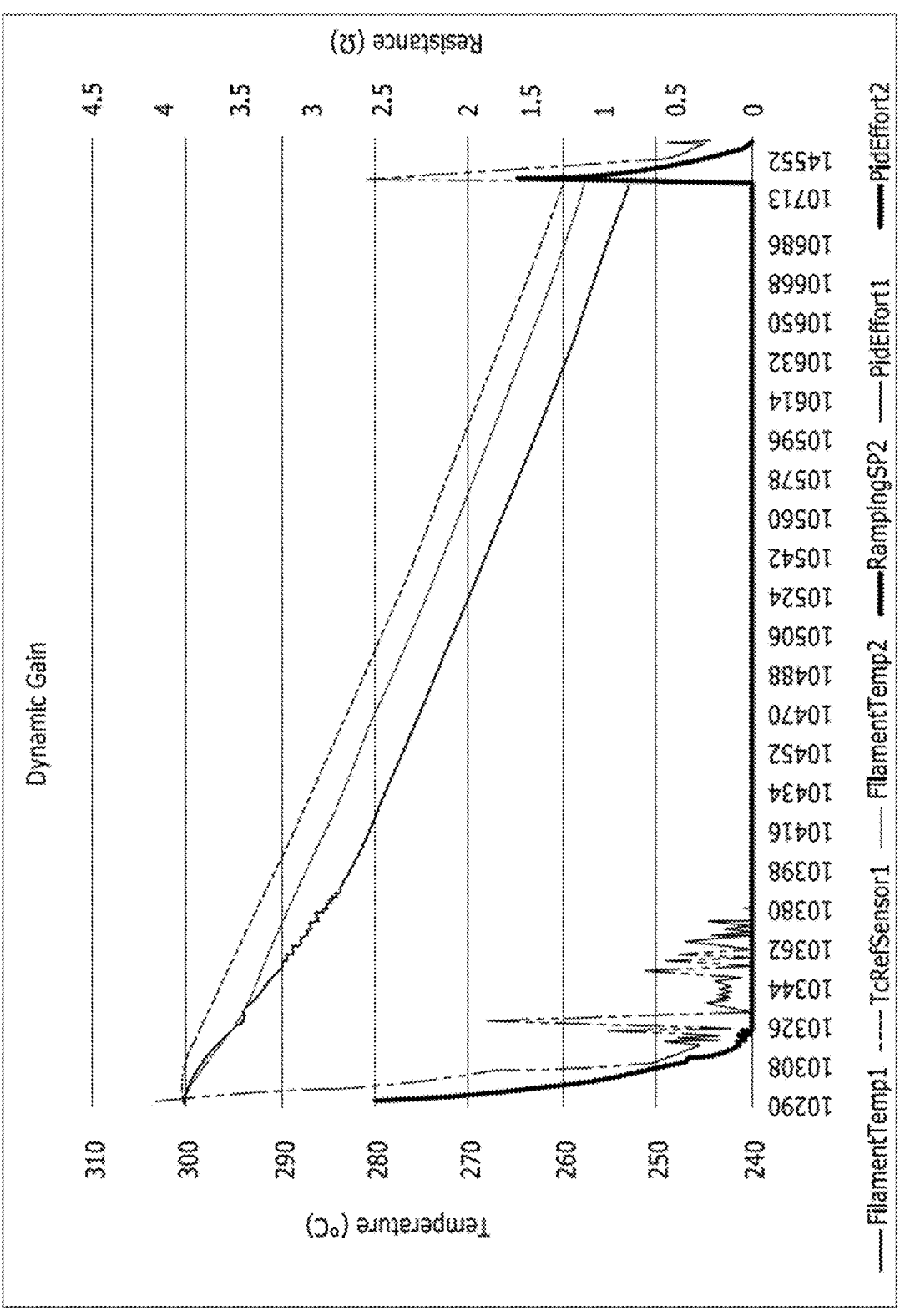
FIG. 5 is a graph illustrating temperature curves determined with a dynamic gain shift in accordance with the teachings of the present disclosure.

By improving the accuracy of the resistance, the control improves the accuracy of the temperature. Specifically, FIGS. 4 and 5 illustrate temperature and PID effort curves without dynamic gain shift (i.e., FilamentTemp1, FilamentTemp2 in FIG. 4) and with dynamic gain shift (i.e., FilamentTemp1, FilamentTemp2 in FIG. 5), respectively. When employing the dynamic gain shift, the filament temperature curves are smoother and closer to a temperature detected by a reference sensor (i.e., TcRefSensor1), thereby improving the resistance or temperature-based control routines associated with the heater 102.

Figure 6B:
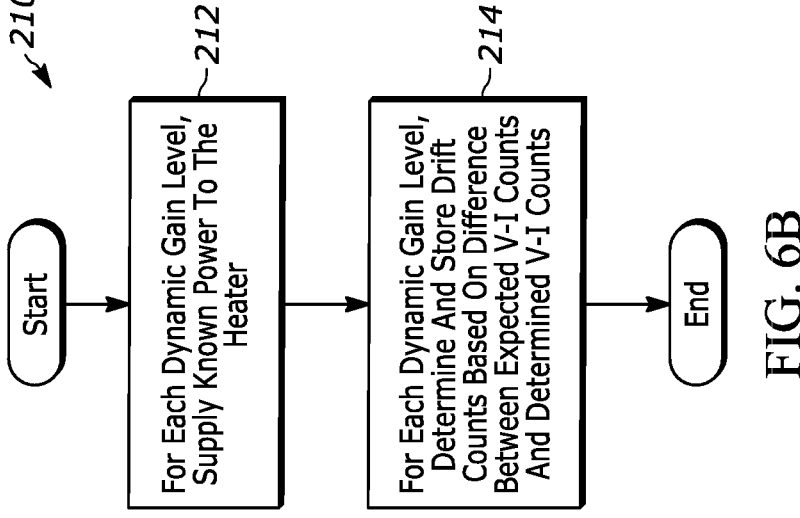
FIG. 6B is a flowchart illustrating another example calibration routine in accordance with the teachings of the present disclosure.
Figure 6A:
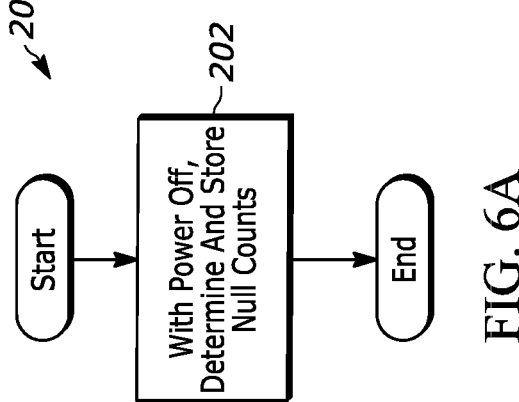
FIG. 6A is a flowchart illustrating an example calibration routine for one or more dynamic gain levels in accordance with the teachings of the present disclosure.

Referring to FIGS. 6A-6B, example calibration routines performed by the control system 104 are provided. FIG. 6A illustrates a calibration routine 200 that can be incorporated at cold start prior to power being applied to the heater 102. At 202, the ECC 130 determines and stores null counts, as described above in greater detail. For example, the ECC 130 measures the VCounts and ICounts when no electric power is provided to the heater 102, and in some variations, for each available dynamic gain level. FIG. 6B illustrates calibration routine 210 that is performed by the ECC 130 to account for induced voltage count and/or current count errors of the sensor circuits 124 at a given temperature. At 212, the control system 104 supplies, for each dynamic gain level of the ADC, a known amount of electrical power to the resistive heating elements of the heater 102. At 214, the ECC 130 determines and stores the drift counts based on the difference between the expected V-I counts and the determined V-I counts, as described above in greater detail.

Figure 6D:
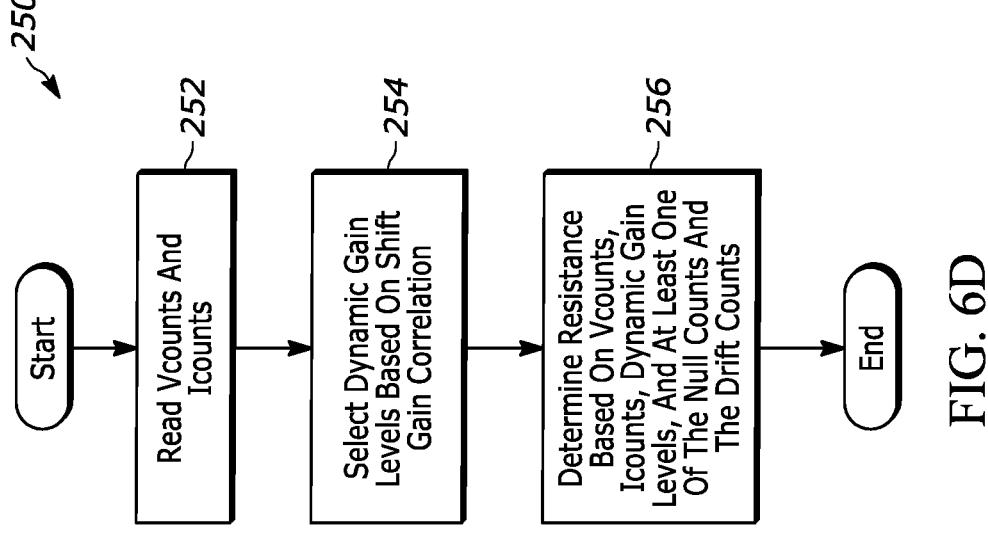
FIG. 6D is a flowchart illustrating another example electrical resistance calculation routine in accordance with the teachings of the present disclosure.
Figure 6C:
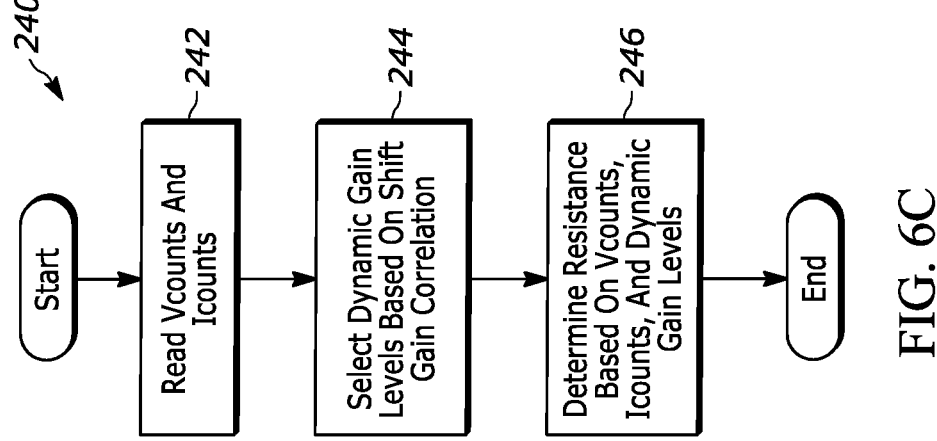
FIG. 6C is a flowchart illustrating an example electrical resistance calculation routine in accordance with the teachings of the present disclosure.

Referring to FIG. 6C, an example resistance calculation routine 240 that can be implemented as part of other control programs, such as a steady-state control or a ramp-down control, for determining resistance of the resistive heating element of the heater 102 are shown. At 242, the ECC 130 reads $V_{Counts}$ and $I_{Counts}$. At 244, the ECC 130 130 selects the dynamic gain levels based on the shift gain correlation, and at 246, the ECC 130 determines the resistance based on the $V_{Counts}$, $I_{Counts}$, and the dynamic gain levels associated with $V_{Counts}$ and $I_{Counts}$. The controller 106 employs the determined resistance to control the heater 102 (e.g., controlling the power applied to the heater 102) in accordance with the main control program being employed.

Referring to FIG. 6D, an example resistance calculation routine 250 that can be implemented as part of other control programs, such as a steady-state control or a ramp-down control, for determining resistance of the resistive heating element of the heater 102 are shown. At 252, the ECC 130 reads $V_{Counts}$ and $I_{Counts}$. At 254, the ECC 130 130 selects the dynamic gain levels based on the shift gain correlation, and at 256, the ECC 130 determines the resistance based on the $V_{Counts}$, $I_{Counts}$, the dynamic gain levels associated with $V_{Counts}$ and $I_{Counts}$, and at least one of the null counts (e.g., the null counts determined by the calibration routine 210 illustrated in FIG. 6A) and the drift counts (e.g., the null counts determined by the calibration routine 220 illustrated in FIG. 6B). The controller 106 employs the determined resistance to control the heater 102 (e.g., controlling the power applied to the heater 102) in accordance with the main control program being employed.

It should be readily understood that the routines can be provided in various suitable ways and should not be limited to the routines of FIGS. 6A-6D. For example, the routine can include a calibration scaling routine to account for offsets inherent to the thermal system.

In one form, the ECC 130 is configured to determine resistance based on V-I counts various operating powers of the heater 102. In another form, the ECC 130 is configured to calculate resistance based on V-I counts when power to the electrical heater (as the heater 102) is below a specific threshold (e.g., 5% input power) and when power is greater than the specific threshold, the ECC 130 reads the calibrated voltage and current values from the sensor circuit 124 and employs the calibrated values to determine the resistance.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" may be replaced with the term "circuit". The term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code may include software, firmware, and/or microcode, and may refer to programs, routines, functions, classes, data structures, and/or objects. The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of controlling temperature of a heater including a resistive heating element, the method comprising:

measuring, by a processor, a voltage count and a current count based on data from an analog-digital converter (ADC) circuit of a sensor circuit, wherein the sensor circuit is electrically coupled to the heater;

selecting, by the processor, a plurality of dynamic gain levels of the ADC based on a shift gain correlation, wherein the plurality of dynamic gain levels include a voltage dynamic gain level and a current dynamic gain level;

determining a voltage value based on a ratio of the voltage count and the voltage dynamic gain level;

determining a current value based on the ratio of the current count and the current dynamic gain level;

determining a resistance of the resistive heating element based on the voltage value and the current value; and controlling, by the processor a control system to power the heater based on the resistance.

2. The method of claim 1, wherein selecting the one or more dynamic gain levels based on the shift gain correlation further comprises:

determining, while the ADC has selected a given voltage dynamic gain level from among the plurality of dynamic gain levels, whether the voltage count is greater than a voltage shift-down threshold; and selecting the voltage dynamic gain level as the one or more dynamic gain levels in response to the voltage count being greater than the voltage shift-down threshold, wherein the voltage dynamic gain level is less than the given voltage dynamic gain level.

3. The method of claim 1, wherein selecting the one or more dynamic gain levels based on the shift gain correlation further comprises:

determining, while the ADC has selected a given voltage dynamic gain level from among the plurality of dynamic gain levels, whether the voltage count is less than a voltage shift-up threshold; and selecting the voltage dynamic gain level as the one or more dynamic gain levels in response to the voltage count being less than the voltage shift-up threshold, wherein the voltage dynamic gain level is greater than the given voltage dynamic gain level.

4. The method of claim 1, wherein selecting the one or more dynamic gain levels based on the shift gain correlation further comprises:

determining, while the ADC has selected a given current dynamic gain level from among the plurality of dynamic gain levels, whether the current count is greater than a current shift-down threshold; and selecting the current dynamic gain level as the one or more dynamic gain levels in response to the current count being greater than the current shift-down threshold, wherein the current dynamic gain level is less than the given current dynamic gain level.

5. The method of claim 1, wherein selecting the one or more dynamic gain levels based on the shift gain correlation further comprises:

determining, while the ADC has selected a given current dynamic gain level from among the plurality of dynamic gain levels, whether the current count is less than a current shift-up threshold; and selecting the current dynamic gain level as the one or more dynamic gain levels in response to the current count being less than the current shift-up threshold, wherein the current dynamic gain level is greater than the given current dynamic gain level.

6. The method of claim 1 further comprising determining a plurality of voltage null counts and a plurality of current null counts when no electrical power is provided to the heater, wherein the resistance is further based on the plurality of voltage null counts and the plurality of current null counts.

7. The method of claim 6, wherein:

each of the plurality of voltage null counts is associated with one of the plurality of dynamic gain levels; and each of the plurality of current null counts is associated with one of the plurality of dynamic gain levels.

8. The method of claim 6, further comprising: further determining the voltage value based on a difference between the voltage count and a given voltage null count from among the plurality of voltage null counts; and further determining the current value based on a difference between the current count and a given current null count from among the plurality of current null counts, wherein the resistance of the resistive heating element is further based on the further determined voltage value and the further determined current value.

9. The method of claim 1 further comprising determining a plurality of voltage drift counts and a plurality of current drift counts, wherein the resistance is further based on the plurality of voltage drift counts and the plurality of current drift counts.

10. A system for controlling temperature of a heater including a resistive heating element, the system comprising:

one or more processors configured to execute instructions stored in a nontransitory computer-readable medium, wherein the instructions comprise:

obtaining data from an analog-digital converter (ADC) circuit of a sensor circuit that is electrically coupled to a heater;

measuring a voltage count and a current count based on the data;

selecting a voltage dynamic gain level and a current dynamic gain level of the ADC from among a plurality of dynamic gain levels based on a shift gain correlation;

determining a voltage value based on a ratio of the voltage count and the voltage dynamic gain level;

determining a current value based on the ratio of the current count and the current dynamic gain level;

determining a resistance of the resistive heating element based on the voltage value and the current value; and controlling by the one or more processors a control system configured to supply power to the heater based on the resistance.

11. The system of claim 10, wherein the instructions for selecting the voltage dynamic gain level based on the shift gain correlation further comprise:

determining, while the ADC has selected a given voltage dynamic gain level from among the plurality of dynamic gain levels, whether the voltage count is greater than a voltage shift-down threshold; and selecting the voltage dynamic gain level in response to the voltage count being greater than the voltage shift-down threshold, wherein the voltage dynamic gain level is less than the given voltage dynamic gain level.

12. The system of claim 10, wherein the instructions for selecting the voltage dynamic gain level based on the shift gain correlation further comprise:

determining, while the ADC has selected a given voltage dynamic gain level from among the plurality of dynamic gain levels, whether the voltage count is less than a voltage shift-up threshold; and selecting the voltage dynamic gain level in response to the voltage count being less than the voltage shift-up threshold, wherein the voltage dynamic gain level is greater than the given voltage dynamic gain level.

13. The system of claim 10, wherein the instructions for selecting the current dynamic gain level based on the shift gain correlation further comprise:

determining, while the ADC has selected a given current dynamic gain level from among the plurality of dynamic gain levels, whether the current count is greater than a current shift-down threshold; and selecting the current dynamic gain level in response to the current count being greater than the current shift-down threshold, wherein the current dynamic gain level is less than the given current dynamic gain level.

14. The system of claim 10, wherein the instructions for selecting the current dynamic gain level based on the shift gain correlation further comprise:

determining, while the ADC has selected a given current dynamic gain level from among the plurality of dynamic gain levels, whether the current count is less than a current shift-up threshold; and selecting the current dynamic gain level in response to the current count being less than the current shift-up threshold, wherein the current dynamic gain level is greater than the given current dynamic gain level.

15. The system of claim 10, wherein the instructions further comprise determining a plurality of voltage null counts and a plurality of current null counts when no electrical power is provided to the heater, and wherein the resistance is further based on the plurality of voltage null counts and the plurality of current null counts.

16. The system of claim 15 wherein:

each of the plurality of voltage null counts is associated with one of the plurality of dynamic gain levels; and each of the plurality of current null counts is associated with one of the plurality of dynamic gain levels.

17. The system of claim 15, further comprising: further determining the voltage value based on a difference between the voltage count and a given voltage null count from among the plurality of voltage null counts; and further determining the current value based on a difference between the current count and a given current null count from among the plurality of current null counts, wherein the resistance of the resistive heating element is further based on the further determined voltage value and the further determined current value.

18. The system of claim 10, wherein the instructions further comprise determining a plurality of voltage drift counts and a plurality of current drift counts, and wherein the resistance is further based on the plurality of voltage drift counts and the plurality of current drift counts.

* * * * *